(12) United States Patent
Yang

(10) Patent No.: US 10,950,609 B2
(45) Date of Patent: Mar. 16, 2021

(54) GATE-ALL-AROUND (GAA) AND FIN FIELD-EFFECT TRANSISTOR (FINFET) HYBRID STATIC RANDOM-ACCESS MEMORY (SRAM)

(71) Applicant: QUALCOMM Incorporated, San Diego, CA (US)

(72) Inventor: Haining Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/511,153

(22) Filed: Jul. 15, 2019

(65) Prior Publication Data
US 2021/0020643 A1 Jan. 21, 2021

(51) Int. Cl.
| | |
|---|---|
| *H01L 27/11* | (2006.01) |
| *H01L 27/092* | (2006.01) |
| *H01L 29/78* | (2006.01) |
| *H01L 29/423* | (2006.01) |
| *H01L 29/786* | (2006.01) |
| *H01L 29/06* | (2006.01) |

(52) U.S. Cl.
CPC ...... *H01L 27/1108* (2013.01); *H01L 27/0922* (2013.01); *H01L 27/0924* (2013.01); *H01L 29/0673* (2013.01); *H01L 29/42392* (2013.01); *H01L 29/7851* (2013.01); *H01L 29/78696* (2013.01)

(58) Field of Classification Search
None
See application file for complete search history.

(56) References Cited

U.S. PATENT DOCUMENTS

| | | | |
|---|---|---|---|
| 8,580,624 B2 * | 11/2013 | Bangsaruntip | B82Y 10/00 257/351 |
| 9,219,064 B2 * | 12/2015 | Kim | H01L 27/092 |
| 10,332,881 B1 * | 6/2019 | Badaroglu | H01L 21/823437 |
| 2009/0289304 A1 * | 11/2009 | Pouydebasque | H01L 27/1211 257/351 |

(Continued)

OTHER PUBLICATIONS

Kaushal, G., Jeong, H., Maheshwaram, S., Manhas. S.K., Dasgupta, S. And Jung, S.O., "Low power SRAM design for 14nnn GAA Si-nanowire technology", Microelectronics Journal, vol. 46, Issue 12, Part A, (2015), pp. 1239-1247. (Year: 2015).*

(Continued)

*Primary Examiner* — J. E. Schoenholtz
(74) *Attorney, Agent, or Firm* — Patterson & Sheridan, LLP

(57) ABSTRACT

Certain aspects of the present disclosure generally relate to a static random-access memory (SRAM) implemented using both a gate-all-around (GAA)-type transistor and a fin field-effect transistor (FinFET). For example, certain aspects are directed to an SRAM memory cell having a flip-flop (FF) having a pull-up (PU) transistor and a pull-down (PD) transistor, and a pass-gate (PG) transistor coupled between a bit line of the SRAM memory cell and the FF, a gate of the PG transistor being coupled to a word line (WL) of the SRAM memory cell. In certain aspects, at least one of the PU transistor, the PD transistor, or the PG transistor comprises a GAA transistor, and at least another one of the PU transistor, the PD transistor, or the PG transistor comprises a FinFET.

16 Claims, 7 Drawing Sheets

(56) References Cited

U.S. PATENT DOCUMENTS

| | | | |
|---|---|---|---|
| 2014/0153323 A1* | 6/2014 | Liaw | G11C 11/412 365/156 |
| 2016/0043092 A1* | 2/2016 | Mojumder | H01L 29/1054 257/369 |
| 2017/0221905 A1* | 8/2017 | Chen | H01L 27/11582 |
| 2018/0233570 A1* | 8/2018 | Hellings | H01L 29/165 |
| 2019/0081049 A1* | 3/2019 | Zang | H01L 29/42392 |
| 2020/0106441 A1* | 4/2020 | Liaw | H01L 27/0924 |
| 2020/0135740 A1* | 4/2020 | Liaw | H01L 29/1033 |

OTHER PUBLICATIONS

Shin, C., "Advanced MOSFET Design and Implication for SRAM Scaling", Diss, University of California, Electrical Engineering and Computer Sciences, Spring 2011. (Year: 2011).*

Dani, L., Singh, G., Kaur, M., "FinFET based 6T SRAM Cell for Nanoscaled Technologies", Internal Journal of Computer Applications (0975-8887), vol. 127, No. 13, pp. 5-10, Oct. 2015. (Year: 2015).*

Yang, C.K., "SRAM Cell, Noise Margin, and Noise", University of California at Los Angeles, EE215B.*

Zheng, P., Liao, Y.B., Damrongsplasit, N., Chiang, M.H., Liu, T.S. King, "Variation Aware Comparative Study of 10 nm GAA verses FinFET 6-t SRAM Performance and Yield", IEEE Transactions on Electron Devices, vol. 61, No. 12, pp. 3949-3954 Dec. 2014 (Year: 2014).*

* cited by examiner

GATE-ALL-AROUND (GAA) AND FIN FIELD-EFFECT TRANSISTOR (FINFET) HYBRID STATIC RANDOM-ACCESS MEMORY (SRAM)

TECHNICAL FIELD

Certain aspects of the present disclosure generally relate to electronic components and, more particularly, to a static random-access memory (SRAM).

BACKGROUND

Transistors are essential components in modern electronic devices. Large numbers of transistors are employed in integrated circuits (ICs) in many modern electronic devices. For example, components such as central processing units (CPUs) and memory systems each employ a large quantity of transistors for logic circuits and memory devices.

As electronic devices become more complex in functionality, so does the need to include a greater number of transistors in such devices. However, as electronic devices are provided in increasingly smaller packages, such as in mobile devices, for example, a greater number of transistors may be provided in a smaller IC chip. This increase in the number of transistors is achieved in part through continued efforts to miniaturize transistors in ICs.

SUMMARY

Certain aspects of the present disclosure generally relate to a static random-access memory (SRAM) implemented using both a gate-all-around (GAA)-type transistor and a fin field-effect transistor (FinFET).

Certain aspects are directed to an SRAM memory cell. The SRAM memory cell generally includes a flip-flop (FF) having a pull-up (PU) transistor and a pull-down (PD) transistor, and a pass-gate (PG) transistor coupled between a bit line (BL) of the SRAM memory cell and the FF, a gate of the PG transistor being coupled to a word line (WL) of the SRAM memory cell. In certain aspects, at least one of the PU transistor, PD transistor, or PG transistor comprises a GAA transistor, and at least another one of the PU transistor, the PD transistor, or the PG transistor comprises a FinFET.

Certain aspects are directed to an SRAM. The SRAM generally includes a plurality of memory cells, each of the plurality of memory cells comprising a FF having a PU transistor and a PD transistor, and a PG transistor coupled between a BL of the SRAM and the FF, a gate of the PG transistor being coupled to one of a plurality of WLs of the SRAM. In certain aspects, at least one of the PU transistor, the PD transistor, or the PG transistor comprises a GAA transistor, and at least another one of the PU transistor, the PD transistor, or the PG transistor comprises a FinFET.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
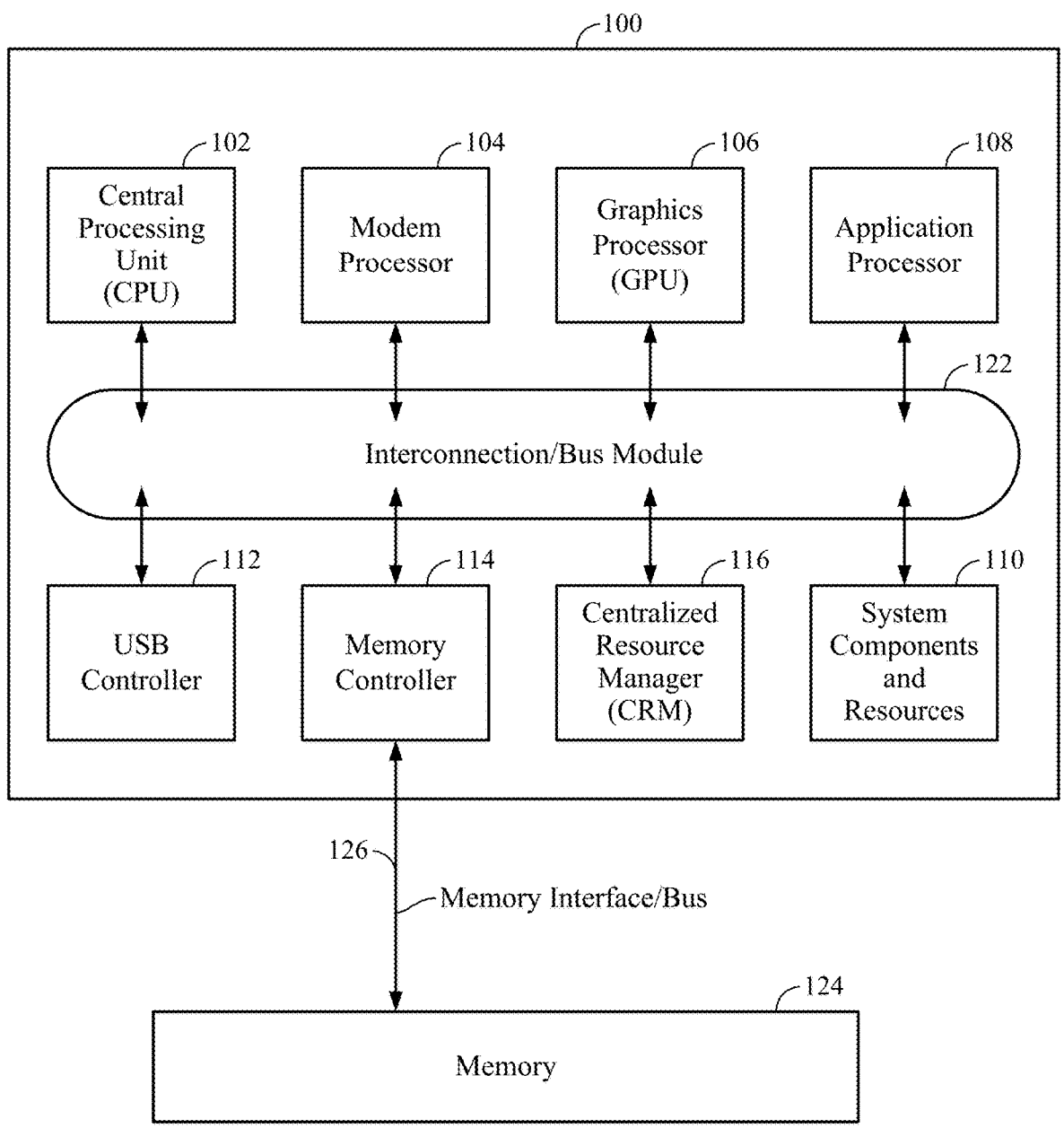
FIG. 1 illustrates example components and interconnections in a system-on-chip (SoC) suitable for implementing various aspects of the present disclosure.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

The various aspects will be described in detail with reference to the accompanying drawings. Wherever possible, the same reference numbers will be used throughout the drawings to refer to the same or like parts. References made to particular examples and implementations are for illustrative purposes, and are not intended to limit the scope of the disclosure or the claims.

The terms "computing device" and "mobile device" are used interchangeably herein to refer to any one or all of servers, personal computers, smartphones, cellular telephones, tablet computers, laptop computers, netbooks, ultrabooks, palm-top computers, personal data assistants (PDAs), wireless electronic mail receivers, multimedia Internet-enabled cellular telephones, Global Positioning System (GPS) receivers, wireless gaming controllers, and similar personal electronic devices which include a programmable processor. While the various aspects are particularly useful in mobile devices (e.g., smartphones, laptop computers, etc.), which have limited resources (e.g., processing power, battery, size, etc.), the aspects are generally useful in any computing device that may benefit from improved processor performance and reduced energy consumption.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions.

The term "system on chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors (DSPs), modem processors, video processors, etc.), memory blocks (e.g., ROM, RAM, flash, etc.), and resources (e.g., timers, voltage regulators, oscillators, etc.), any or all of which may be included in one or more cores.

FIG. 1 illustrates example components and interconnections in a system-on-chip (SoC) 100 suitable for implementing various aspects of the present disclosure. The SoC 100 may include a number of heterogeneous processors, such as a processor 102 (e.g., central processing unit (CPU)), a modem processor 104, a graphics processor 106, and an application processor 108. Each processor 102, 104, 106, 108, may include one or more cores, and each processor/core may perform operations independent of the other processors/cores. The processors 102, 104, 106, 108 may be organized in close proximity to one another (e.g., on a single substrate, die, integrated chip, etc.) so that the processors may operate at a much higher frequency/clock rate than would be possible if the signals were to travel off-chip. The proximity of the cores may also allow for the sharing of on-chip memory and resources (e.g., voltage rails), as well as for more coordinated cooperation between cores.

The SoC 100 may include system components and resources 110 for managing sensor data, analog-to-digital conversions, and/or wireless data transmissions, and for performing other specialized operations (e.g., decoding high-definition video, video processing, etc.). System components and resources 110 may also include components such as voltage regulators, oscillators, phase-locked loops (PLLs), peripheral bridges, data controllers, system controllers, access ports, timers, and/or other similar components used to support the processors and software clients running on the computing device. The system components and resources 110 may also include circuitry for interfacing with peripheral devices, such as cameras, electronic displays, wireless communication devices, external memory chips, etc.

The SoC 100 may further include a Universal Serial Bus (USB) controller 112, one or more memory controllers 114, and a centralized resource manager (CRM) 116. The SoC 100 may also include an input/output module (not illustrated) for communicating with resources external to the SoC, each of which may be shared by two or more of the internal SoC components.

The processors 102, 104, 106, 108 may be interconnected to the USB controller 112, the memory controller 114, system components and resources 110, CRM 116, and/or other system components via an interconnection/bus module 122, which may include an array of reconfigurable logic gates and/or implement a bus architecture (e.g., CoreConnect, AMBA, etc.). Communications may also be provided by advanced interconnects, such as high performance networks on chip (NoCs).

The interconnection/bus module 122 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the interconnection/bus module 122 may implement an arbitration scheme to prevent multiple master components from attempting to drive the bus simultaneously.

The memory controller 114 may be a specialized hardware module configured to manage the flow of data to and from a memory 124 via a memory interface/bus 126. In certain aspects of the present disclosure, the memory 124 may be a static random-access memory (SRAM). The SRAM may be implemented using both a gate-all-around (GAA)-type transistor and a fin field-effect transistor (FinFET), as described in more detail herein.

The memory controller 114 may comprise one or more processors configured to perform read and write operations with the memory 124. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In certain aspects, the memory 124 may be part of the SoC 100.

Example Static Random Access Memory (SRAM)

Figure 2:
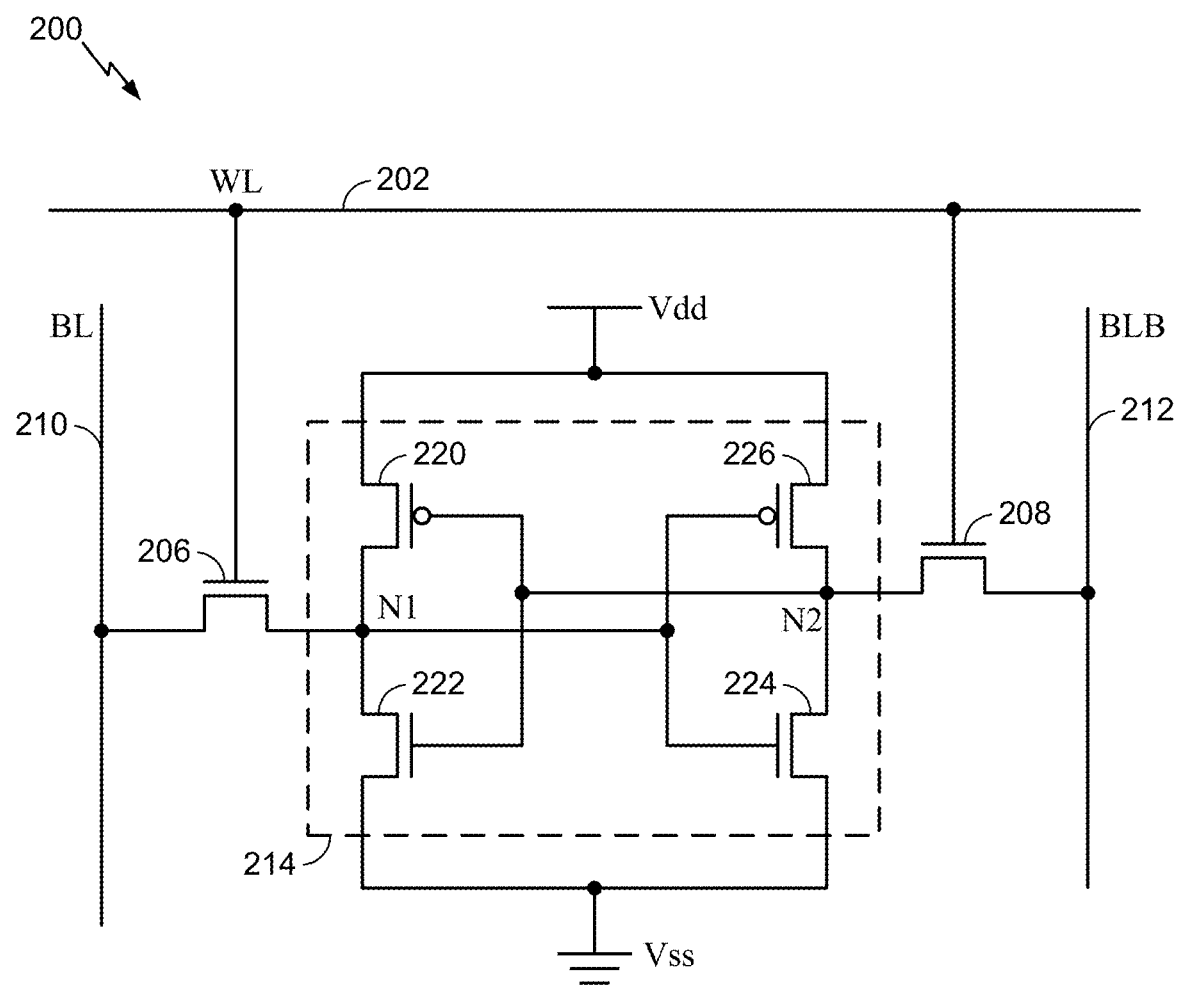
FIG. 2 illustrates a memory cell of a static random access memory (SRAM), in accordance with certain aspects of the present disclosure.

FIG. 2 illustrates a memory cell 200 of a static random access memory (SRAM) (e.g., memory 124), in accordance with certain aspects of the present disclosure. As illustrated, the memory cell 200 may be coupled to a word line (WL) 202 of the SRAM. The WL 202 is coupled to a control input of a pass gate (PG) transistor 206 for selectively coupling a bit line (BL) 210 of the SRAM to node N1 (also referred to as an output node) of a flip-flop (FF) 214, and is coupled to a control input of a PG transistor 208 for selectively coupling the complementary bit line (BLB) 212 to node N2 (also referred to as a complementary output node) of the FF 214. The PG transistor 206 and/or the PG transistor 208 may each be implemented using a metal-oxide-semiconductor (MOS) transistor of various types, such as a GAA-type transistor or a FinFET, as described in more detail herein.

As illustrated, the FF 214 is coupled between a voltage rail (Vdd) and a reference potential node (e.g., electric ground or Vss). The FF 214 includes a pull-up (PU) transistor 220 (e.g., a p-type metal-oxide-semiconductor (PMOS) transistor) having a drain coupled to a drain of a pull-down (PD) transistor 222 (e.g., n-type metal-oxide-semiconductor (NMOS) transistor), forming part of node N1. The FF 214 also includes a PU transistor 226 having a drain coupled to a drain of a PD transistor 224, forming part of node N2. The gates of the PU transistor 220 and the PD transistor 222 are coupled to the node N2, and the gates of the PU transistor 226 and the PD transistor 224 are coupled to the node N1, as illustrated. The nodes N1 and N2 represent the output and complementary output nodes of the FF 214, respectively.

During a read operation, the BL of the SRAM may be pre-charged to Vdd, and then the WL of the SRAM is selected. On the side of the memory cell storing a logical low, the BL may be discharged via a PG transistor and a PD transistor, so that a differential voltage develops between the BL and the BLB of the memory cell. The differential voltage should be large enough for a sense amplifier to detect the state of the cell. The differential voltage should not be too large, however; otherwise, the cross-coupled transistors (inverters) of the FF 214 could flip states, causing a read disturbance failure. A read disturbance failure may be caused by a weak PU transistor (e.g., PU transistors 220, 226) having insufficient drive current strength. A read failure may also occur if a PD transistor (e.g., PD transistors 222, 224) of the SRAM is weak (e.g., has low drive current strength).

During a write operation, the bit lines are driven to complementary voltage levels via a write driver, and then the word line is selected. On the side of the memory cell for which the bit line voltage is logic low, the storage node (e.g., N1) of the flip-flop is discharged through the PG transistor. The cross-coupled inverters raise the voltage on the opposite storage node and latch the cell. The discharging strength of the PG transistor should overcome the restoring strength of the PU transistor. Therefore, a write failure may occur if the PG transistor is weak.

The SRAM memory cell characteristics are impacted by the PU/PD transistor drive current strength ratio. As used herein, drive current strength generally refers to a transistor's capability to drive current (e.g., drain-to-source current (Ids) or source-to-drain current (Isd)) to a specific node. SRAM functionality depends on the transistor drive current strength ratios, which may be referred to as alpha and beta ratios. The alpha ratio generally refers to the ratio of the drive current strength of the PD transistor over the drive current strength of the PG transistor. The beta ratio generally refers to the ratio of the drive current strength of the PU transistor over the drive current strength of the PG transistor.

To avoid the memory failures described herein, the drive current strength of the PD transistor should be higher than the drive current strength of the PG transistor, and the drive current strength of the PG transistor should be higher than the drive current strength of the PU transistor. To overcome fin field-effect transistor (FinFET) SRAM memory cell shortcomings, read/write assistance circuitry may be implemented, which increase SRAM area, especially when many small SRAM compiler instances are used in a design. Aspects of the present disclosure provide techniques for reducing memory failures while maintaining a relatively small SRAM footprint as compared to conventional implementations.

Complementary metal-oxide-semiconductor (CMOS) technology has scaled from planar transistor to FinFET, and may migrate to nano-sheet gate-all-around (GAA) devices. GAA devices may overcome FinFET device scaling restrictions with improved short channel effect, channel length reduction, and gate pitch reduction. GAA technology allows for an increase of drive current strength for the transistor with a larger effective device width. GAA drive current strength may be adjusted by changing the nano-sheet width (e.g., the width of channel slabs of the GAA device), as described in more detail herein.

Certain aspects of the present disclosure are directed to an SRAM memory cell implemented using both FinFET and GAA transistors, allowing the SRAM to be realized with improved performance and/or higher density as compared to conventional implementations. For example, the SRAM memory cell may include a PD transistor implemented as a GAA transistor and a PU transistor implemented as a FinFET. As another example, the SRAM memory cell may include a PD transistor implemented as a GAA transistor with PG and PU transistors implemented as FinFETs. The GAA transistor provides flexibility to design an SRAM memory cell with improved drive current strength ratios, as described herein. On the other hand, FinFET technology allows for a low number of transistors to be implemented using a small area with little to no sacrifice of the drive current strength of the transistors. In other words, a FinFET device with a single fin may provide higher drive current strength as compared to GAA transistors given the same footprint.

Figure 3A:
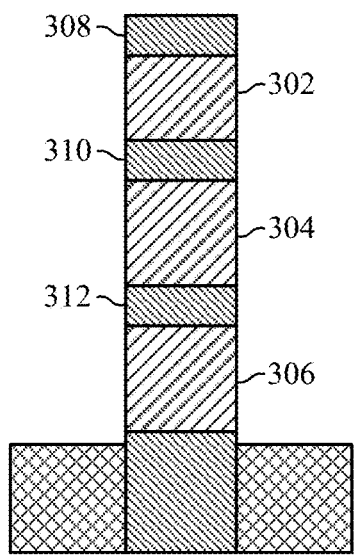
FIGS. 3A, 3B, 3C, and 3D are cross-sectional views of an example gate-all-around (GAA) transistor and illustrate example operations for fabricating the GAA transistor.
Figure 3B:
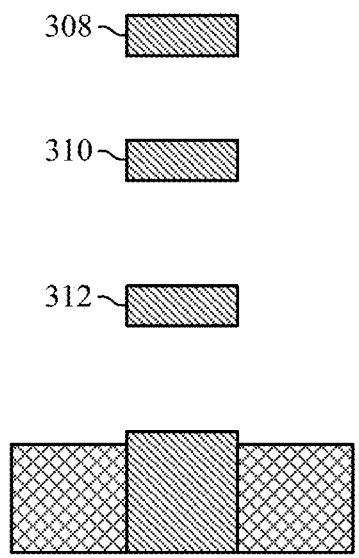
Figure 3C:
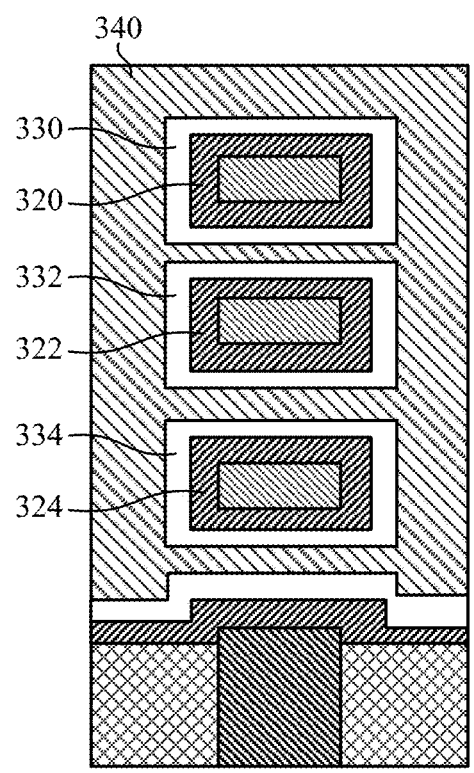
Figure 3D:
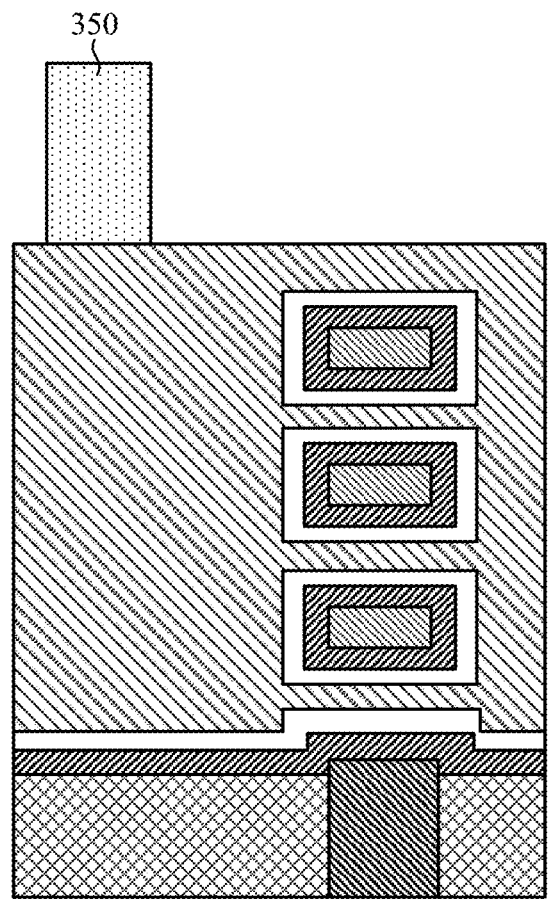

FIGS. 3A, 3B, 3C, and 3D are cross-sectional views of an example GAA transistor and illustrate example operations for fabricating the GAA transistor. As illustrated in FIG. 3A, first semiconductor layers 302, 304, 306 (e.g., silicon germanium (SiGe)) and second semiconductor layers 308, 310, 312 (e.g., silicon layers, also referred to herein as "channel slabs") may be formed using an epitaxial growth process, followed by a patterning of the silicon to form active regions. As illustrated in FIG. 3B, the first semiconductor layers 302, 304, 306 may be removed in the GAA channel region. As illustrated in FIG. 3C, high-k dielectric regions 320, 322, 324, work function metal regions 330, 332, 334, and metal gate region 340 may be formed all around the channel slabs of the GAA transistor. As illustrated in FIG. 3D, a gate contact 350 may be formed for electrical connection to the metal gate region 340.

Figure 4A:
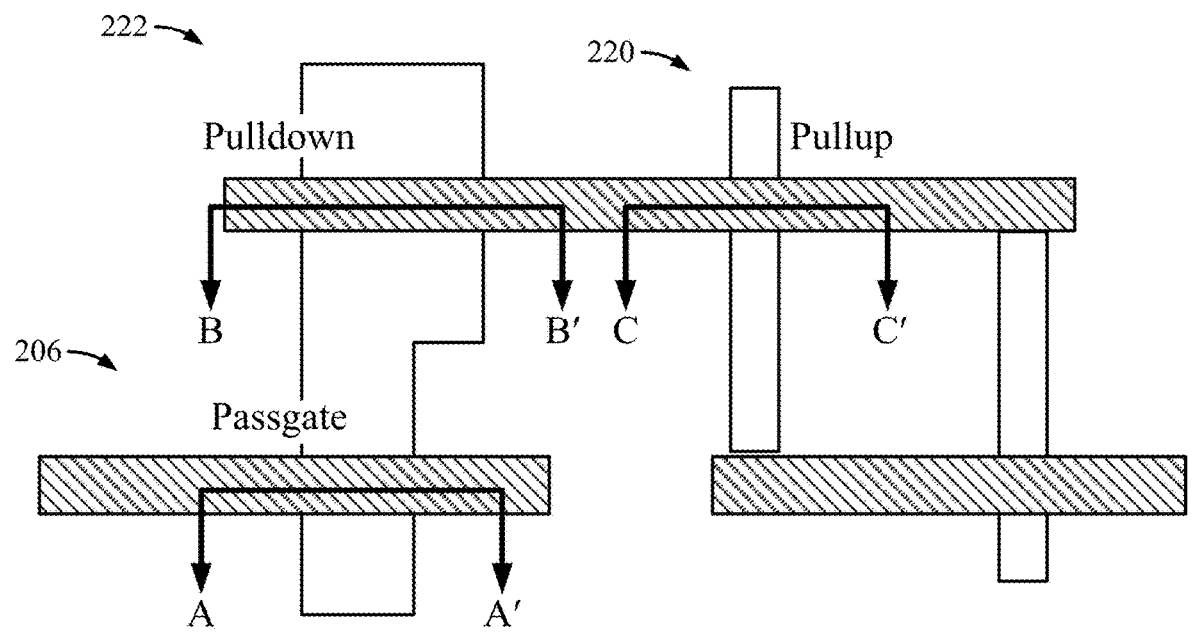
FIGS. 4A and 4B are top and cross-sectional views, respectively, of an example SRAM having pass-gate (PG) and pull-down (PD) transistors implemented as GAA transistors and a pull-up (PU) transistor implemented as a fin field-effect transistor (FinFET), in accordance with certain aspects of the present disclosure.
Figure 4B:
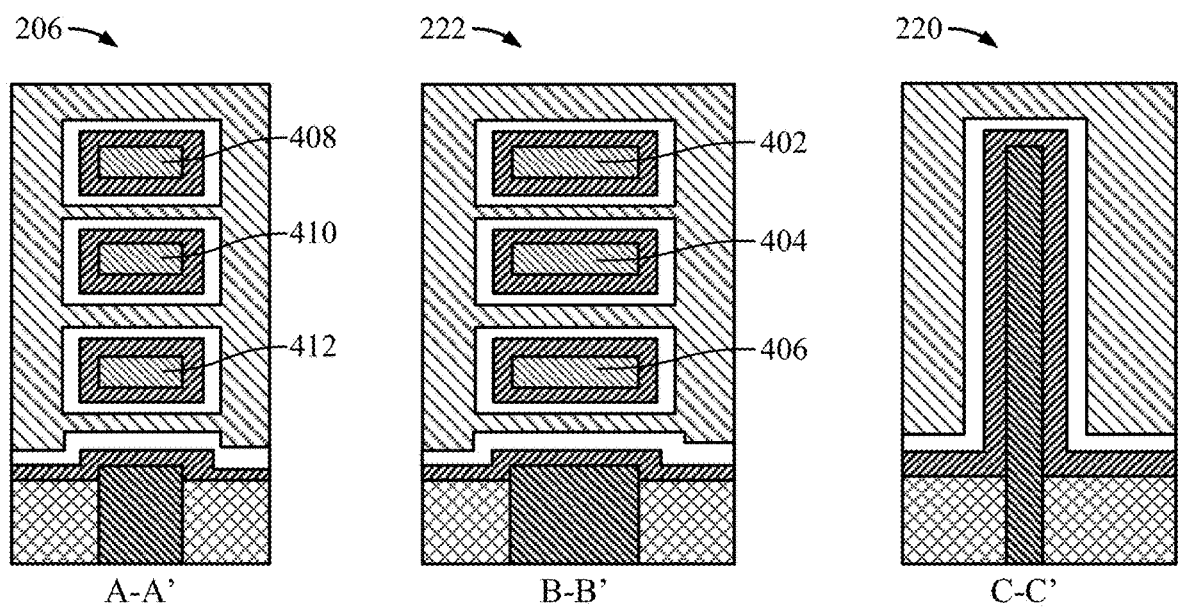

FIGS. 4A and 4B are top and cross-sectional views, respectively, of an example SRAM having PG and PD transistors implemented as GAA transistors and a PU transistor implemented as a FinFET, in accordance with certain aspects of the present disclosure. For instance, the PD transistor 222 and PG transistor 206 may be implemented as GAA transistors, and the PU transistor 220 is implemented as a FinFET. The PD transistor 222 of FIG. 4B is a cross-section taken through line B-B' in FIG. 4A, the PG transistor 206 of FIG. 4B is a cross-section taken through line A-A' in FIG. 4A, and the PU transistor 220 of FIG. 4B is a cross-section taken through line C-C' in FIG. 4A. The PU transistor 220 is implemented as a FinFET due to the relatively small footprint of FinFETs as compared to GAA transistors given the same drive current strength.

The PD transistor 222 implemented as a GAA transistor may have wider channel slabs 402, 404, 406 as compared to the slabs 408, 410, 412 of the PG transistor 206, such that the drive current strength of the PD transistor 222 is greater than the drive current strength of the PG transistor 206. Moreover, the PU transistor 220 may be implemented as a FinFET having lower drive current strength than the PG transistor 206 and having a smaller footprint as compared to the PG transistor 206.

Figure 5A:
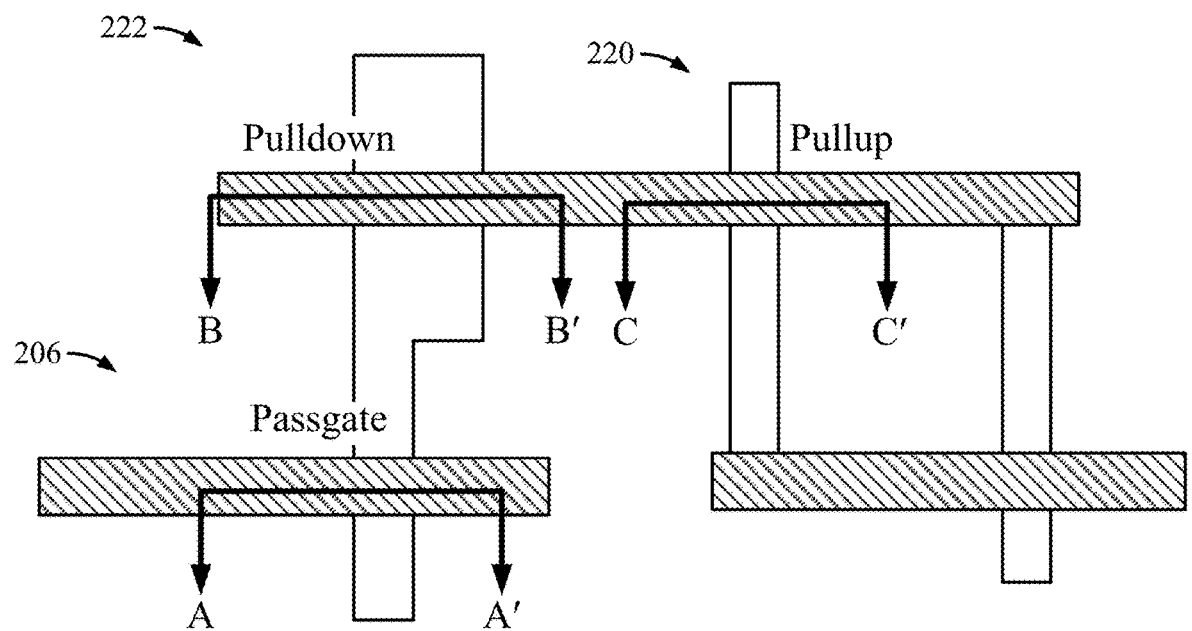
FIGS. 5A and 5B are top and cross-sectional views, respectively, of an example SRAM having a PD transistor implemented as a GAA transistor and PU and PG transistors implemented as FinFETs, in accordance with certain aspects of the present disclosure.
Figure 5B:
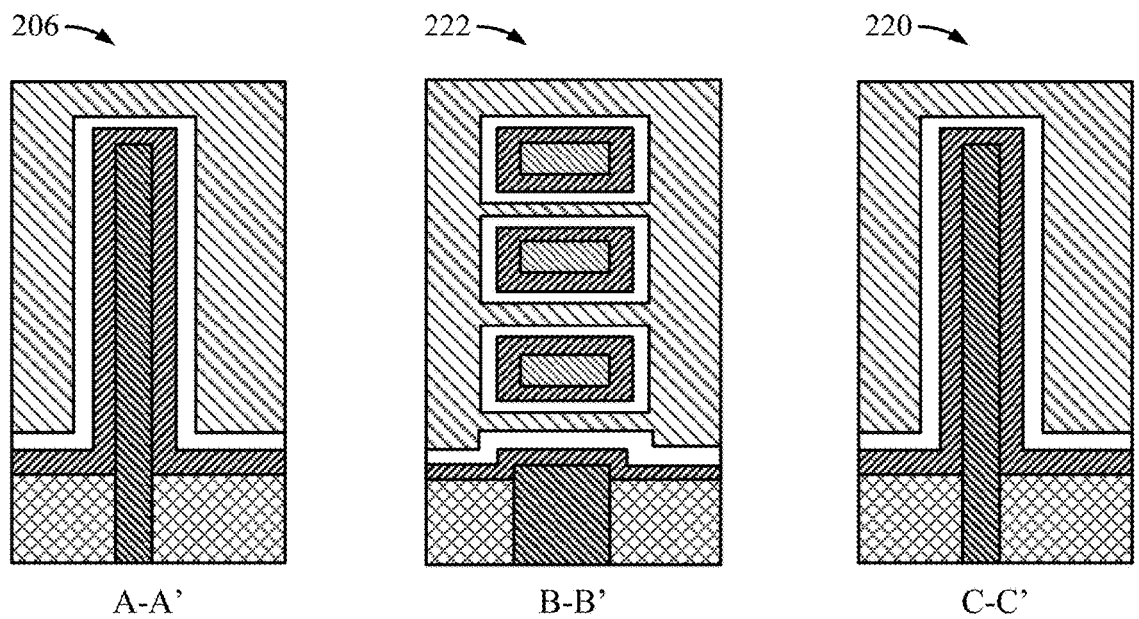

FIGS. 5A and 5B are top and cross-sectional views, respectively, of an example SRAM having a PD transistor implemented as a GAA transistor and PU and PG transistors implemented as FinFETs, in accordance with certain aspects of the present disclosure. For instance, the PD transistor 222 may be implemented as a GAA transistor, while the PU transistor 220 and the PG transistor 206 may be implemented as FinFETs. The PG transistor 206 of FIG. 5B is a cross-section taken through line A-A' in FIG. 5A, the PD transistor 222 of FIG. 5B is a cross-section taken through line B-B' in FIG. 5A, and the PU transistor 220 of FIG. 5B is a cross-section taken through line C-C' in FIG. 5A. The PU transistor 220 and the PG transistor 206 are implemented as FinFETs due to the relatively small footprint of FinFETs as compared to GAA transistors given the same drive current strength. Thus, the PD transistor 222 may have a stronger drive current strength as compared to the PG transistor 206. In certain aspects, the PG transistor 206 may be implemented with a lower drive current strength as compared to the PU transistor.

Figure 6A:
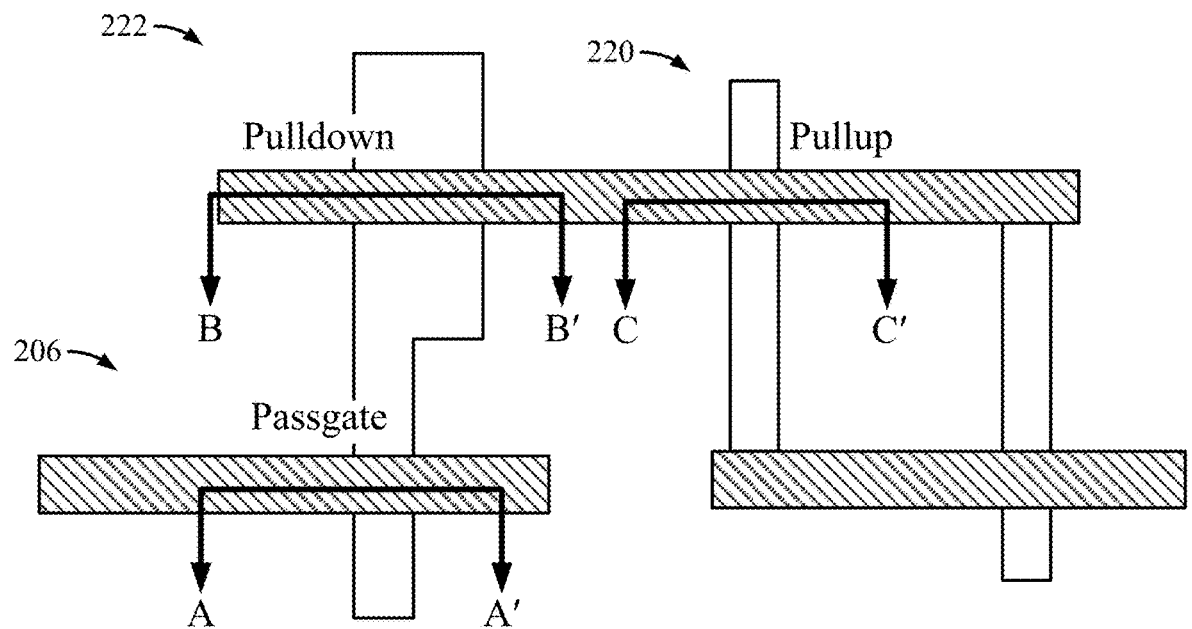
FIGS. 6A and 6B are a top and cross-sectional views, respectively, of an example SRAM having PD and PU transistors implemented as GAA transistors and a PG transistor implemented as a FinFET, in accordance with certain aspects of the present disclosure.
Figure 6B:
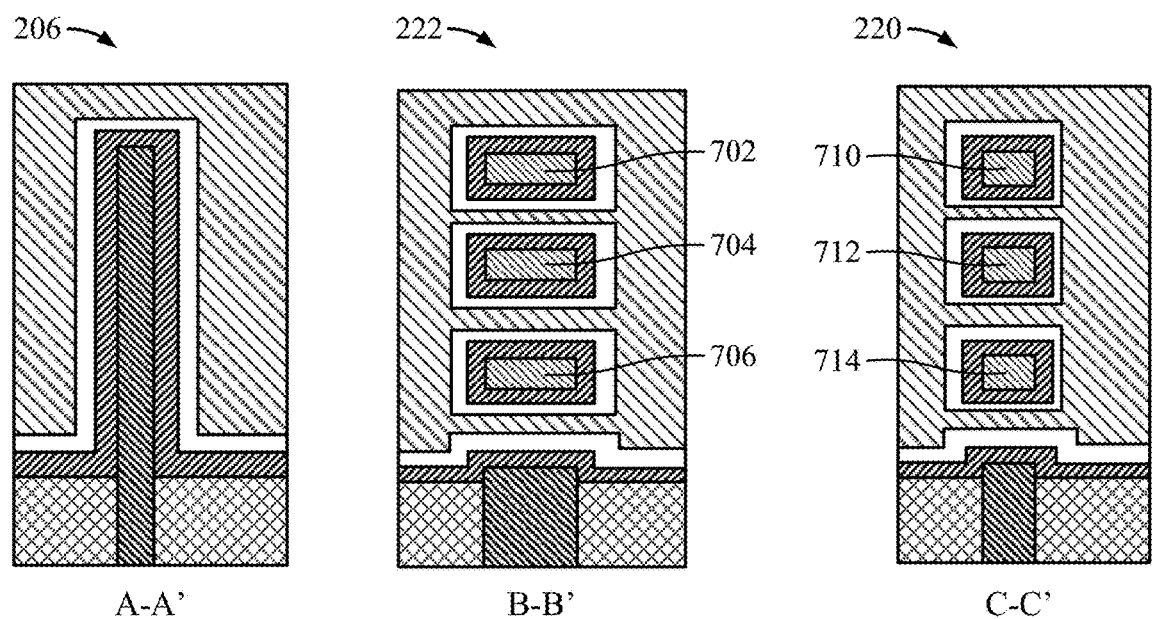

FIGS. 6A and 6B are top and cross-sectional views, respectively, of an example SRAM having PD and PU transistors implemented as GAA transistors and a PG transistor implemented as a FinFET, in accordance with certain aspects of the present disclosure. For instance, the PD transistor 222 and the PU transistor 220 are implemented as GAA transistors, while the PG transistor 206 is implemented as a FinFET. The PG transistor 206 of FIG. 6B is a cross-section taken through line A-A' in FIG. 6A, the PD transistor 222 of FIG. 6B is a cross-section taken through line B-B' in FIG. 6A, and the PU transistor 220 of FIG. 6B is a cross-section taken through line C-C' in FIG. 6A. As illustrated, the PD transistor 222 is implemented with relatively wide slabs 702, 704, 706 (e.g., as compared to the PU transistor 220) such that the PD transistor 222 has a higher drive current strength as compared to PG transistor 206 implemented as a FinFET. The PU transistor 220 is implemented as a GAA transistor with relatively short slabs 710, 712, 714 (e.g., as compared to the PD transistor 222) such that the PU transistor 220 has a lower drive current strength as compared to the PG transistor 206 implemented as a FinFET.

Figure 7A:
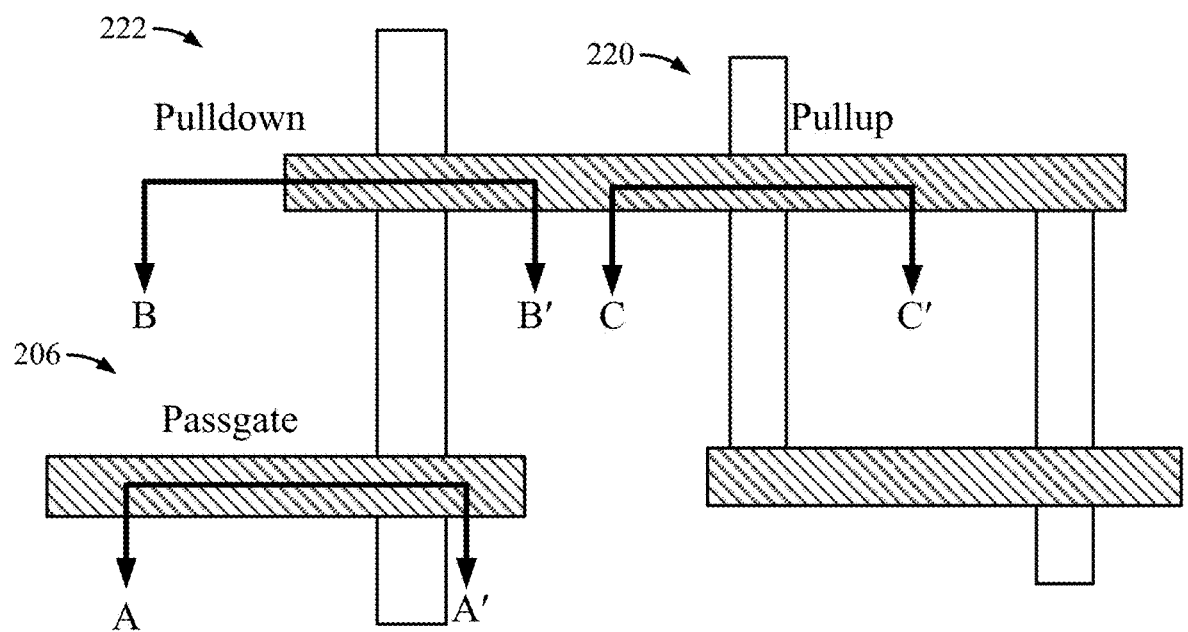
FIGS. 7A and 7B are top and cross-sectional views, respectively, of an example SRAM having PG and PU transistors implemented as GAA transistors and a PD transistor implemented as a FinFET, in accordance with certain aspects of the present disclosure.
Figure 7B:
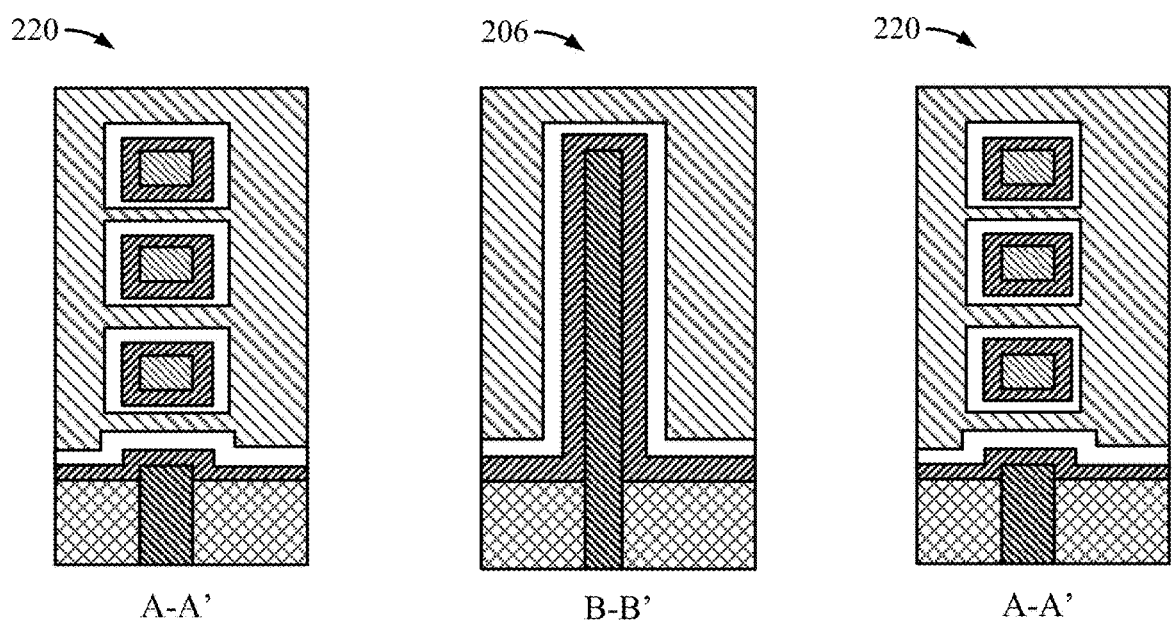

FIGS. 7A and 7B are top and cross-sectional views, respectively, of an example SRAM having PG and PU transistors implemented as GAA transistors and a PD transistor implemented as a FinFET, in accordance with certain aspects of the present disclosure. For instance, the PG transistor 206 and the PU transistor 220 are implemented as GAA transistors, while the PD transistor 222 is implemented as a FinFET. The PG transistor 206 of FIG. 7B is a cross-section taken through line A-A' in FIG. 7A, the PD transistor 222 of FIG. 7B is a cross-section taken through line B-B' in FIG. 7A, and the PU transistor 220 of FIG. 7B is a cross-section taken through line C-C' in FIG. 7A. As illustrated, the PG transistor 206 and the PU transistor 220 are implemented as GAA transistors with short slab widths such that the drive current strength of the PG transistor 206 and the PU transistor 220 are less than the drive current strength of the PD transistor 222 implemented as a FinFET.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A static random-access memory (SRAM) memory cell, comprising:
   a flip-flop (FF) having a pull-up (PU) transistor and a pull-down (PD) transistor; and
   a pass-gate (PG) transistor coupled between a bit line (BL) of the SRAM memory cell and the FF, a gate of the PG transistor being coupled to a word line (WL) of the SRAM memory cell, wherein:
      the PD transistor comprises a gate-all-around (GAA) transistor;

the PG transistor comprises a first fin field-effect transistor (FinFET); and the PU transistor comprises a second FinFET.

2. The SRAM memory cell of claim 1, wherein a drive current strength of the PD transistor is greater than a drive current strength of the PG transistor.

3. The SRAM memory cell of claim 1, wherein:
the PG transistor comprises an n-type metal-oxide-semiconductor (NMOS) transistor;
the PD transistor comprises another NMOS transistor; and
the PU transistor comprises a p-type metal-oxide-semiconductor (PMOS) transistor having a source coupled to the NMOS transistor and to a source of the other NMOS transistor.

4. The SRAM memory cell of claim 1, wherein a a drive current strength of the PG transistor is less than a drive current strength of the PU transistor.

5. A static random-access memory (SRAM) memory cell comprising:
a flip-flop (FF) having a pull-up (PU) transistor and a pull-down (PD) transistor; and
a pass-gate (PG) transistor coupled between a bit line (BL) of the SRAM memory cell and the FF, a gate of the PG transistor being coupled to a word line (WL) of the SRAM memory cell, wherein:
the PG transistor comprises a fin field-effect transistor (FinFET);
the PD transistor comprises a first gate-all-around (GAA) transistor; and
the PU transistor comprises a second GAA transistor.

6. The SRAM memory cell of claim 5, wherein a width of a channel slab of the PD transistor is greater than a width of a channel slab of the PU transistor.

7. The SRAM memory cell of claim 5, wherein a drive current strength of the PD transistor is greater than a drive current strength of the PG transistor.

8. The SRAM memory cell of claim 1, wherein the GAA transistor comprises a channel and a gate region surrounding the channel.

9. The SRAM memory cell of claim 1, wherein each of the first FinFET and the second FinFET comprises a fin and a gate region adjacent to at least two sides of the fin.

10. A static random-access memory (SRAM), comprising:
a plurality of memory cells, each of the plurality of memory cells comprising:
a flip-flop (FF) having a pull-up (PU) transistor and a pull-down (PD) transistor; and
a pass-gate (PG) transistor coupled between a bit line (BL) of the SRAM and the FF, a gate of the PG transistor being coupled to one of a plurality of word lines (WLs) of the SRAM, wherein:
the PG transistor comprises a first gate-all-around (GAA) transistor;
the PU transistor comprises a second GAA transistor; and
the PD transistor comprises a fin field-effect transistor (FinFET).

11. The SRAM of claim 10, wherein a drive current strength of the PG transistor is less than a drive current strength of the PD transistor.

12. The SRAM of claim 10, wherein:
the PG transistor comprises an n-type metal-oxide-semiconductor (NMOS) transistor;
the PD transistor comprises another NMOS transistor; and
the PU transistor comprises a p-type metal-oxide-semiconductor (PMOS) transistor having a source coupled to the NMOS transistor and to a source of the other NMOS transistor.

13. The SRAM of claim 10, wherein a drive current strength of the PU transistor is less than a drive current strength of the PD transistor.

14. The SRAM memory cell of claim 5, wherein a drive current strength of the PU transistor is less than the drive current strength of the PG transistor.

15. The SRAM of claim 10, wherein a width of a channel slab of the PG transistor is smaller than a width of a channel slab of the PD transistor.

16. The SRAM of claim 10, wherein a width of a channel slab of the PU transistor is smaller than a width of a channel slab of the PD transistor.

* * * * *